United States Patent
Akiyama et al.

(10) Patent No.: US 10,649,294 B2
(45) Date of Patent: May 12, 2020

(54) DISPLAY DEVICE

(71) Applicant: SHARP KABUSHIKI KAISHA, Sakai, Osaka (JP)

(72) Inventors: Hiroto Akiyama, Sakai (JP); Shingo Kamitani, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/182,943

(22) Filed: Nov. 7, 2018

(65) Prior Publication Data

US 2019/0137835 A1 May 9, 2019

(30) Foreign Application Priority Data

Nov. 8, 2017 (JP) ................. 2017-215557

(51) Int. Cl.
G02F 1/1362 (2006.01)
H01L 27/12 (2006.01)
G02F 1/1343 (2006.01)
H01L 29/786 (2006.01)
G02F 1/1368 (2006.01)

(52) U.S. Cl.
CPC .. G02F 1/136286 (2013.01); G02F 1/134309 (2013.01); G02F 1/136259 (2013.01); H01L 27/1225 (2013.01); H01L 27/1244 (2013.01); G02F 1/1368 (2013.01); G02F 2001/134372 (2013.01); G02F 2001/136268 (2013.01); G02F 2001/136272 (2013.01); G02F 2201/501 (2013.01); H01L 29/7869 (2013.01)

(58) Field of Classification Search
CPC ........ G02F 1/136286; G02F 1/134309; G02F 1/136259; G02F 1/1368; G02F 2001/134372; G02F 2001/136272; G02F 2201/501; H01L 27/1244
See application file for complete search history.

(56) References Cited

U.S. PATENT DOCUMENTS

2006/0256249 A1  11/2006  Nagano et al.
2007/0146591 A1*  6/2007  Kimura ............ G02F 1/133345
                                                              349/114

FOREIGN PATENT DOCUMENTS

JP   2005-283870 A   10/2005
JP   2006-317516 A   11/2006
JP   2007-052128 A   3/2007

* cited by examiner

Primary Examiner — Feifei Yeung Lopez
(74) Attorney, Agent, or Firm — ScienBiziP, P.C.

(57) ABSTRACT

A display device includes a pixel electrode, a signal line, a pixel electrode, and a blocking portion. The signal line is configured to transmit a signal to the pixel electrode. The pixel electrode connecting line is disposed a predefined distance apart from the signal line and connected to the pixel electrode. The blocking portion is disposed between a connecting portion of the pixel electrode connected to the pixel electrode connecting line and the signal line to block an electric field between the connection portion and the signal line.

10 Claims, 8 Drawing Sheets

|  | Csd1 | Csd2 |
|---|---|---|
| COMPARATIVE EXAMPLE | 0.000586pF | 0.000236pF |
| PRACTICAL EXAMPLE | 0.000428pF | 0.000218pF |
| DIFFERENCE | 0.000158pF | 0.000018pF |
| RATE OF IMPROVEMENT | 27.0% | 7.6% |

FIG.7

DISPLAY DEVICE

CROSS REFERENCE TO RELATED APPLICATION

This application claims priority from Japanese Patent Application No. 2017-215557 filed on Nov. 8, 2017. The entire contents of the priority application are incorporated herein by reference.

TECHNICAL FIELD

The technology described herein relates to a display device.

BACKGROUND

A known liquid crystal display component configured to operate in FFs mode includes unit pixels each including openings in areas on a common electrode corresponding to overlapping areas between gate electrodes and drain electrodes. The common electrode is formed in a plate shape (a solid pattern). The openings are provided for repair and defined as repair openings. An example of such a liquid crystal display component is disclosed in Japanese Unexamined Patent Application Publication No. 2007-52128.

A laser beam is applied to a drain electrode through the corresponding repair opening to cut the drain electrode so that a short circuit is not developed between the corresponding gate electrode and the common electrode. However, an electric field may be generated between pixel electrodes and data lines through the repair openings. A parasitic capacitance may be induced by the electric field and the parasitic capacitance may result in a decrease in display quality.

SUMMARY

The technology described herein was made in view of the above circumstances. An object is to maintain display quality.

A display device includes a pixel electrode, a signal line, a pixel electrode, and a blocking portion. The signal line is configured to transmit a signal to the pixel electrode. The pixel electrode connecting line is disposed a predefined distance apart from the signal line and connected to the pixel electrode. The blocking portion is disposed between a connecting portion of the pixel electrode connected to the pixel electrode connecting line and the signal line to block an electric field between the connection portion and the signal line.

According to the configuration, a voltage based on a signal transmitted through the signal line is applied to the pixel electrode via the pixel electrode connecting line. The blocking portion is disposed between the connecting portion of the pixel electrode connected to the pixel electrode connecting line and the signal line to block an electric field between the connection portion and the signal line. With the blocking portion, a parasitic capacitance induced by the electric field between the connecting portion of the pixel electrode and the signal line is reduced and thus the display quality is less likely to decrease.

According to the technology described herein, the display quality is less likely to decrease.

DETAILED DESCRIPTION

First Embodiment

A first embodiment will be described with reference to FIGS. 1 to 6. A liquid crystal panel 11 (a display panel) included in a liquid crystal display device 10 will be described. X-axes, Y-axes, and Z-axes may be present in the drawings. The axes in each drawing correspond to the respective axes in other drawings. The upper side and the lower side in FIGS. 4 and 5 correspond to a front side and a back side of the liquid crystal panel 11, respectively.

Figure 1:
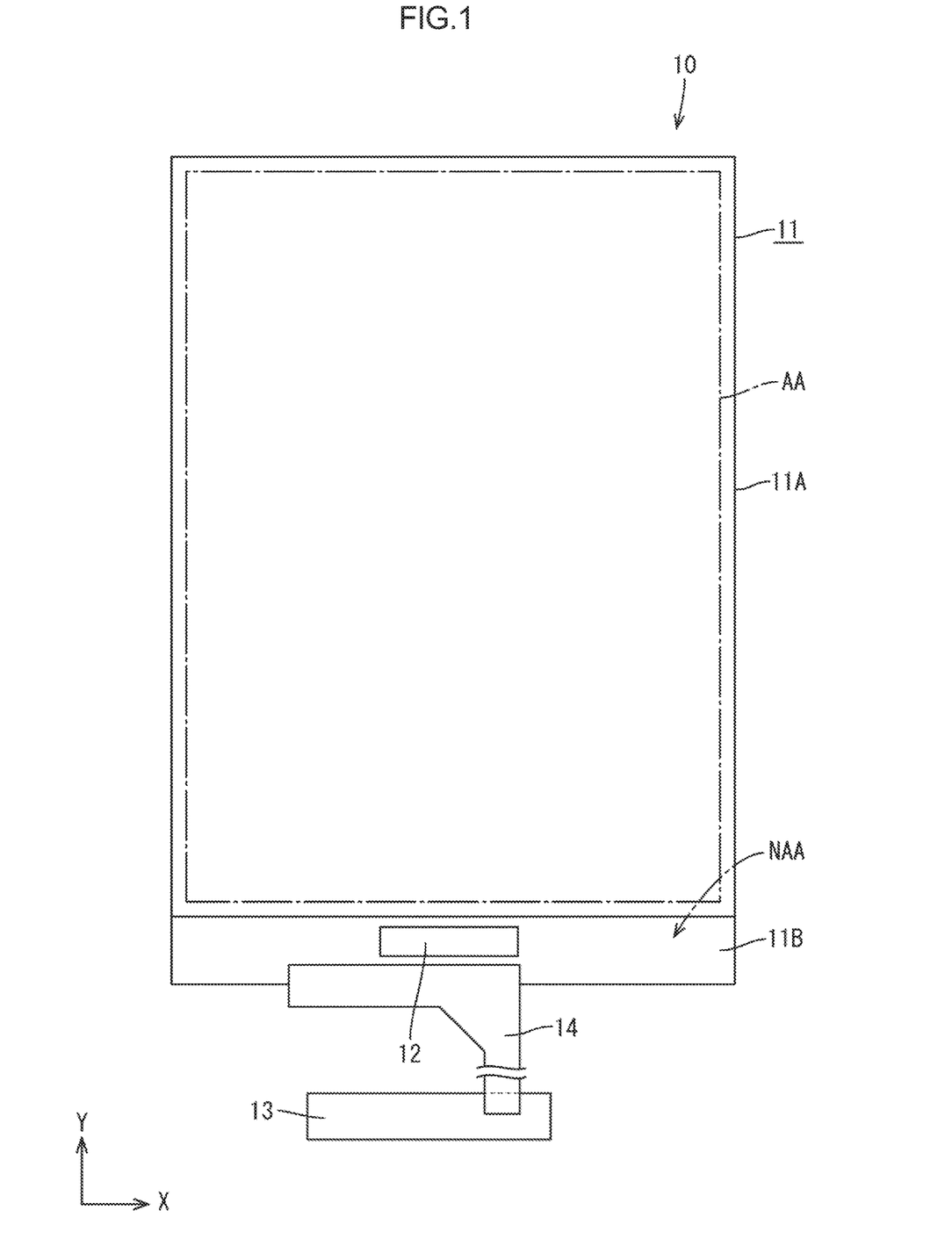
FIG. 1 is a schematic plan view illustrating connection between a liquid crystal panel including a driver and a control circuit board via a flexible circuit board according to a first embodiment.

As illustrated in FIG. 1, the liquid crystal display device 10 includes the liquid crystal panel 11, a driver 12 (a panel driver, a driver circuit), a control circuit board 13 (an external signal source), a flexible circuit board 14 (an external component connector), and a backlight unit. The liquid crystal panel 11 is configured to display images. The driver 12 is configured to drive the liquid crystal panel 11. The control circuit board 13 is provided separately from the driver 12 and configured to supply various signals to the driver 12. The flexible circuit board 14 electrically connects the liquid crystal panel 11 to the control circuit board 13. The backlight unit is an external light source disposed behind the liquid crystal panel 11 and configured to illuminate the liquid crystal panel 11 for image display. The driver 12 and die flexible circuit board 14 are mounted on the liquid crystal panel 11 via an anisotropic conductive film (ACF).

As illustrated in FIG. 1, the liquid crystal panel 11 has a vertically-long rectangular shape. An inner area of a plate surface of the liquid crystal panel 11 is defined as a display area (an active area) AA in which images are displayed. An outer area of the plate surface to surround the display area AA is a non-display area (non-active area) NAA. The non-display area NAA has a frame shape in a plan view. A short direction and a long direction of the liquid crystal panel 11 correspond with the X-axis direction and the Y-axis direction in the drawings, respectively. The thickness direction of the liquid crystal panel 11 corresponds with the Z-axis direction in the drawings. In FIG. 1, the display area AA is represented with a chain line. The area outside the chain line is the non-display area NAA. The liquid crystal panel 11 includes at least glass substrates 11A and 11B. One of the glass substrates 11A and 11B on the front side is a CF substrate 11A (a common substrate) and the other on the rear side (the back side) an array substrate 11B (a thin film transistor substrate, an active matrix substrate, a TFT substrate). Polarizing plates are attached to outer surfaces of the substrates 11A and 11B, respectively.

Figure 2:
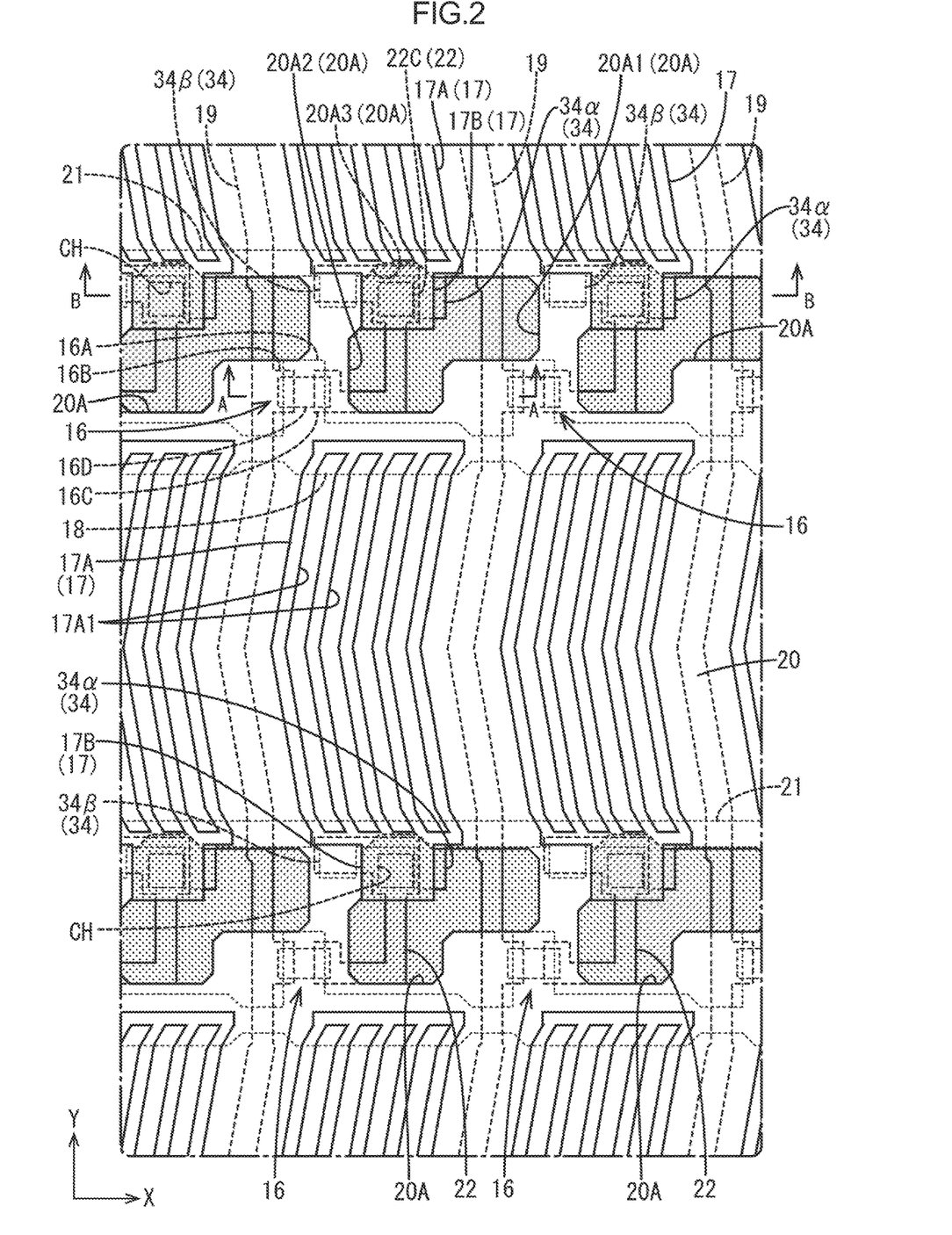
FIG. 2 is a plan view schematically illustrating a two-dimensional configuration of an array substrate included in the liquid crystal panel in a display area.

As illustrated in FIG. 2, thin film transistors (TFTs) 16 and pixel electrodes 17 are disposed in a matrix on an inner surface of the array substrate 11B in the display area AA. The TFTs 16 are switching components. Gate lines 18 (scanning lines) and source lines 19 (signal lines, data lines) are routed in a grid to surround the TFTs 16 and the pixel electrodes 17. The gate lines 18 linearly extend in the X-axis direction. The source lines 19 extend in zigzag along substantially Y-axis direction. The TFTs include gate electrodes 16A, source electrodes 16B, drain electrodes 16C, and channels 16D. The gate electrodes 16A are connected to the gate lines 18. The source electrodes 16B are connected to the source lines 19. The drain electrodes 16C are connected to the pixel electrodes 17 via drain lines 22, which will be described later. The channels 16D are connected to the source electrodes 16B and the drain electrodes 16C. The TFTs 16 are driven based on scanning signals supplied to the gate lines 18. Voltages related to image signals supplied to the source lines 19 are applied to the drain electrodes 16C via the channel 16D and the pixel electrodes 17 are charged to potentials based on the image signals. The source lines 19 extend in the Y-axis direction for an entire dimension of the display area AA and ends of the source lines 19 are disposed in the non-display area NAA. Auxiliary lines are routed in the non-display area NAA to overlap the ends of the source lines 19 with a gate insulating film 26 between the ends of the source lines 19 and the auxiliary lines. When the source lines 19 have defects such as broken lines and short circuits, the defective source lines 19 are cut and the ends of the defective source lines 19 are electrically connected to the auxiliary lines. The image signals can be supplied to the TFTs 16 connected to the defective source lines 19 via the auxiliary lines.

As illustrated in FIG. 2, each pixel electrode 17 is disposed in a vertically-long rectangular area defined by two gate lines 18 and two source lines 19. A long edge of each pixel electrode 17 bends along the corresponding source line 19 so that the long edge of the pixel electrode 17 is parallel to the corresponding source line 19. Each pixel electrode 17 includes slits 17A1 (four slits in FIG. 2) which extends along the long edge of the pixel electrode 17. A common electrode 20 is formed in a substantially solid pattern on the inner surface of the array substrate 11B to overlap the pixel electrodes 17 in the display area AA. The configuration of the common electrode 20 will be described in detail later. When a potential difference is created between the pixel electrode 17 and the common electrode 20 that overlaps the pixel electrode 17, a fringe electric field (an oblique electric field) including component along the plate surface of the array substrate 11B and a component in a normal direction to the plate surface of the array substrate 11B is applied to an area around the slits 17A1 in a liquid crystal layer 11C. Namely, the liquid crystal panel 11 operates in fringe field switching (FFS) mode. Capacitance lines 21 are disposed between the gate lines 18 that sandwich the pixel electrodes 17 in the Y-axis direction. Each capacitance line 21 is parallel to the gate lines 18 to cross pixel electrodes 17 and the source lines 19. The capacitance lines 21 are disposed in a layer different from the layers in which the pixel electrodes 17 and the source lines 19 are disposed. The capacitance lines 21 overlap the pixel electrodes 17 to form capacitors between the pixel electrodes 17 and the capacitance lines 21. With the capacitance lines 21, the potential to which the pixel electrodes 17 are charged as the TFTs 16 are driven are hold for certain time. The capacitance lines 21 are disposed in the layer in which the gate lines 18 are disposed. Preferably, the capacitance lines 21 are at the same potential as the common electrode 20. However, it is necessary to set the potential of the capacitance lines 21 to the same potential as the common electrode 20.

Figure 3:
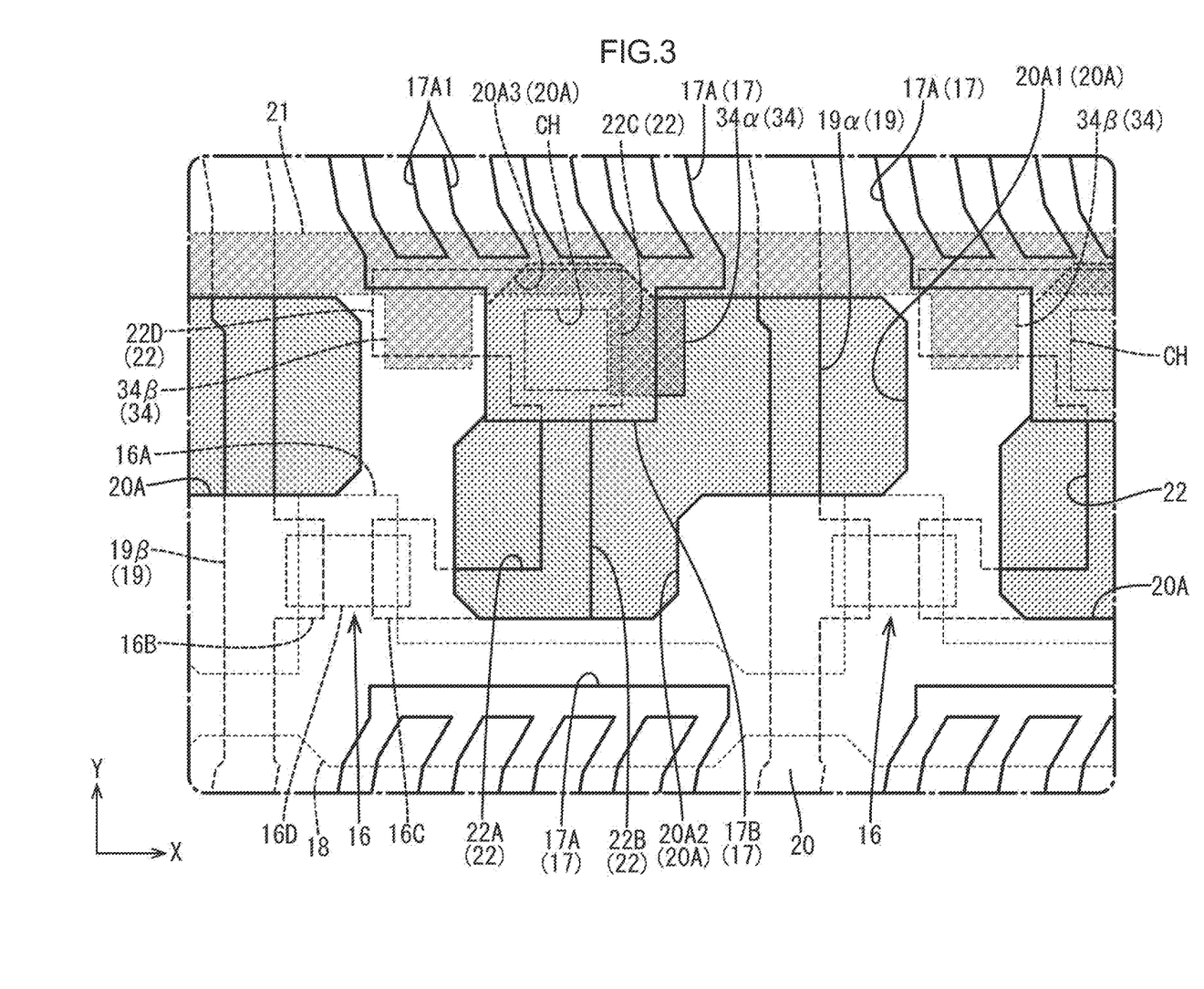
FIG. 3 is a magnified plan view of a TFT and therearound on the array substrate in the display area.

As illustrated in FIG. 3, the TFTs 16 are disposed adjacent to lower edges of the pixel electrodes 17 to which the TFTs 16 are connected with respect to the Y-axis direction in FIG. 3. The gate electrode 16A of each TFT 16 branches off from the corresponding gate line 18 and protrudes from the gate line 18 toward the corresponding pixel electrode 17 along the Y-axis direction. The source electrode 16B of each TFT 16 branches off from the corresponding source line 19 and protrudes from the corresponding source line 19 toward the corresponding date electrode 16A along the X-axis direction. A distal end of the source electrode 16B overlaps the corresponding; gate electrode 16A. The drain electrode 16C of each TFT 16 is disposed a certain distance apart from the corresponding source electrode 16B in the X-axis direction. The drain electrode 16C overlaps the corresponding gate electrode 16A. The drain electrodes 16C are disposed in the layer in which the source electrodes 16B are disposed. First ends of the drain lines 22 (pixel electrode connecting lines), which will be described later, are connected to the drain electrodes 16C. The channel 16D of each TFT 16 is disposed to overlap the corresponding gate electrode 16A with the gate insulating film 26 between the channel 16D and the gate electrode 16A. The channel 16D is connected to the corresponding source electrode 16B and the corresponding drain electrode 16C. The channel 16D extends in the X-axis direction to cross the gate electrode 16A. A first end of the channel 16D is connected to the source electrode 16B and a second end of the channel 16D is connected to the drain electrode 16C.

The drain lines 22 will be described in detail. The drain lines 22 are disposed in the layer in which the drain electrodes 16C are disposed. As illustrated in FIG. 3, the second ends of the drain lines 22 on opposite sides from the drain electrodes 16C are connected to the respective pixel electrodes 17. The drain lines 22 include first portions 22A, second portions 22B, third portions 22D. The first portion 22A of each drain line 22 extends from the corresponding drain electrode 16C to an opposite side from the source electrode 16B (the right side in FIG. 3) in the X-axis direction. The second portion 22B of the drain line 22 extends from a distal end of the first portion 22A toward the corresponding pixel electrode 17 (the upper side in FIG. 3) in the Y-axis direction. The second portions 22B include distal ends that are defined as electrode connecting ends 22C. The electrode connecting ends 22C are connected to the respective pixel electrodes 17. The third portion 22D of the drain line 22 extends from the electrode connecting end 22C of the drain line 22 toward the corresponding source line 19 in the X-axis direction (the left side in FIG. 3). The corresponding source line 19 is to which the TFT 16 is connected. Each drain line 22 has a reversed C-shape in a plan view. The pixel electrodes 17 to which the respective drain lines 22 are connected include electrode bodies 17A in which the slits 17A1 are formed and drain line connecting portions 17B (connecting portions). The drain line connecting portions 17B protrude from the electrode bodies 17A toward the respective TFTs 16 in the Y-axis direction, respectively. The drain line connecting portions 17B are connected to the drain lines 22, respectively. Each drain line connecting portion 17B and the corresponding electrode connecting end 22C that are connected to each other are disposed between the corresponding capacitance line 21 and the corresponding second portion 22B with respect to the Y-axis direction. The drain line connecting portion 17B and the electrode connecting end 22C are off the middle of two source lines 19 that sandwich the pixel electrode 17 with respect to the X-axis direction. Specifically, the drain line connecting portion 17B and the electrode connecting end 22C are closer to the source line 19 on the right side in FIG. 3. The source line 19 on the right side in FIG. 3 and the source line 19 on the left side in FIG. 3 are defined as a first source line 19α (a first signal line) and a second source line 19β (a second signal line), respectively. The first source line 19α and the second source line 19β are disposed with a distance of the first source line 19α from the drain line connecting portion 17B and the electrode connecting end 22C and a distance of the second source line 19β from the drain line connecting portion 17B and the electrode connecting end 22C different from each other. The distance of the first source line 19α is less than the distance of the second source line 19β. In the following paragraphs, two source lines 19 sandwiching the corresponding pixel electrode 17, that is, the first source line 19α and the second source line 19β will be described as an example of pairs of the source lines 19. The second source line 19β includes the source electrode 16B. Namely, the second source line 19β is connected to the pixel electrode 17. The first source line 19α is not connected to the pixel electrode 17 but connected to the pixel electrode 17 on the right side in FIG. 3 with respect to the pixel electrode 17 to which the second source line 19β is connected.

Figure 4:
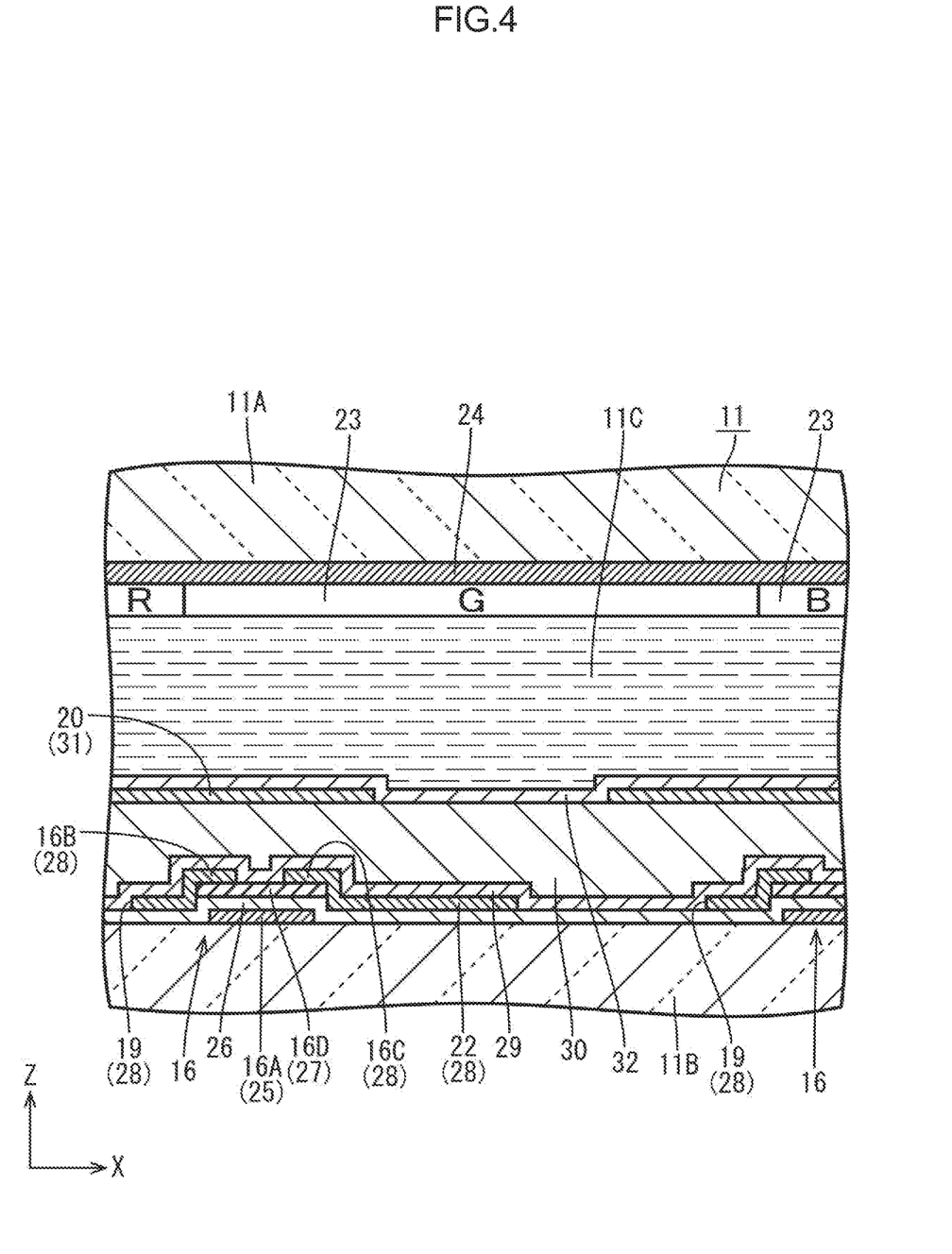
FIG. 4 is a cross-sectional view along line A-A in FIG. 2.

As illustrated in FIG. 4, the liquid crystal layer 11C is disposed between the CF substrate 11A and the array substrate 11B. The liquid crystal layer 11C includes liquid crystal molecules that change optical characteristics according to application of an electric field. Color filters 23 are disposed on an inner surface of the CF substrate 11A opposed to the array substrate 11B via the liquid crystal layer 11C in the display area AA. The color filters 23 are disposed in a matrix to be opposed to the pixel electrodes 17, respectively. The color filters 23 include red (R), green (G), and blue (B) color portions that are repeatedly arranged. A light blocking portion 24 (a black matrix) is disposed among the color filters 23 to reduce color mixture. Alignment films are disposed on in the innermost layers on the CF substrate 11A and the array substrate 11B the closest to the liquid crystal layer 11C to control orientations of the liquid crystal molecules in the liquid crystal layer 11C.

Next, films formed in layers on the inner surface of the array substrate 11B will be described. On the array substrate 11B, as illustrated in FIG. 4, a first metal film 25 (a gate metal film), the gate insulating film 26, a semiconductor film 27, a second metal film 28 (a source metal film), a first interlayer insulating film 29, a planarization film 30, a first transparent electrode film 31, a second interlayer insulating film 32, and a second transparent electrode film 33 are disposed in layers in this sequence from the lower side.

The first metal film 25 is a multilayer film including different metal films that are laminated or a single layer film made of single metal material. As illustrated in FIGS. 3 and 4, the gate lines 18, the capacitance lines 21, the gate electrodes 16A of the TFTs 16, and the auxiliary lines are formed from the first metal film 25. The gate insulating film 26 is made of inorganic insulating material (inorganic material) such as SiNx and SiO2. The semiconductor film 27 is a thin film made of oxide semiconductor. The channels 16D of the TFTs 16 are formed from the semiconductor film 27. The second metal film 28 is a multilayer film or a single layer film similar to the first metal film 25. The source lines 19, the drain lines 22, the source electrodes 16B and the drain electrodes 16C of the TFTs 16 are formed from the second metal film 28. The first interlayer insulating film 29 is made of inorganic insulating material similar to the gate insulating film 26. The planarization film 30 is made of organic insulating material (organic material) such as PMMA (acrylic). The planarization film 30 has a thickness greater than the thicknesses of other insulating films 26, 29, and 32 that are made of inorganic resin material. The second interlayer insulating film 32 is made of inorganic insulating material similar to the gate insulating film 26. The second transparent electrode film 33 is made of transparent electrode film material similar to the first transparent electrode film 31. The pixel electrodes 17 are formed from the second transparent electrode film 33. The first interlayer insulating film 29, the planarization film 30, and the second interlayer insulating film 32 include contact holes CH through which the pixel electrodes 17 are connected to the drain lines 22. The contact holes CH are arranged to overlap the drain line connecting portions 17B of the pixel electrodes 17 and the electrode connecting ends 22C of the drain lines 22 in a plan view. Except for the contact holes CH, the first interlayer insulating film 29, the planarization film 30, and the second interlayer insulating film 32 are formed in solid patterns at least for the entire display area AA.

As illustrated in FIG. 2, the common electrode 20 includes openings 20A in areas that cover at least sections of the source lines 19 and drain line connecting portions 17B of the pixel electrodes 17. In FIGS. 2 and 3, the areas in which the openings 20A are formed are indicated with hatching that is different from hatching of blocking portions 34, which will be described later. The areas in which the openings 20A are formed cover not only the sections of the source lines 19 and drain line connecting portions 17B but also sections of the drain lines 22. As illustrated in FIG. 3, each opening 20A includes a first opening section 20A1, a second opening section 20A2, and a third opening section 20A3 that communicate with each other. The first opening section 20A1 overlaps the first source line 19α and areas on sides of the first source line 19α. The second opening section 20A2 overlaps the drain line 22 and areas on sides of the drain line 22. The third opening section 20A3 overlaps the drain line connecting portion 17B, the electrode connecting end 22C, and the contact hole CH. The third opening section 20A3 is for restricting the drain line connecting portion 17B that is disposed in the layer upper than the common electrode 20 from being shorted to the common electrode 20 during passing of the drain line connecting portion 17B through the contact hole CH to reach the electrode connecting end 22C that is disposed in the layer lower than the common electrode 20. The first opening section 20A1 and the second opening section 20A2 are for restricting the source line 19 from being shorted to the common electrode 20 and the drain line 22 from being shorted to the common electrode 20 during application of a laser beam to the source line 19 and the drain line 22 for repair.

If a short circuit is developed between the first source line 19α and the gate line 18, the laser beam is applied to the first source line 19α via the first opening section 20A1 to cut the first source line 19α and connect the first source line 19α to the auxiliary line. After the repair, the image signals are supplied to the TFTs 16 connected to the first source line 19α via the auxiliary line. Because the first opening section 20A1 extends in the X-axis direction beyond the first source line 19α, a section of the source line 19α to which the laser beam is applied is less likely to be shorted to the common electrode 20. If a short circuit is developed between the gate line 18 and the drain line 22 or between the gate electrode 16A and the drain electrode 16C, the laser beam is applied to the second portion 22B of the drain line 22 via the second opening section 20A2 to cut the second portion 22B and to connect the capacitance line 21 to the pixel electrode 17. After the repair, a pixel that may be recognized as a bright spot due to the short circuit between the gate line 18 and the drain line 22 or between the gate electrode 16A and the drain electrode 16C can be darkened. Because the second opening section 20A2 extends in the X-axis direction beyond the drain line 22, a section of the drain line 22 to which the laser beam is applied is less likely to be shorted to the common electrode 20. Furthermore, the common electrode 20 is not present between the drain line connecting portion 17B and the first source line 19α because of the opening 20A. Therefore, an electric field is more likely to be generated between the drain line connecting portion 17B and the first source line 19α. The display quality may be reduced due to the parasitic capacitance induced by the electric field between the drain line connecting portion 17B and the first source line 19α.

Figure 5:
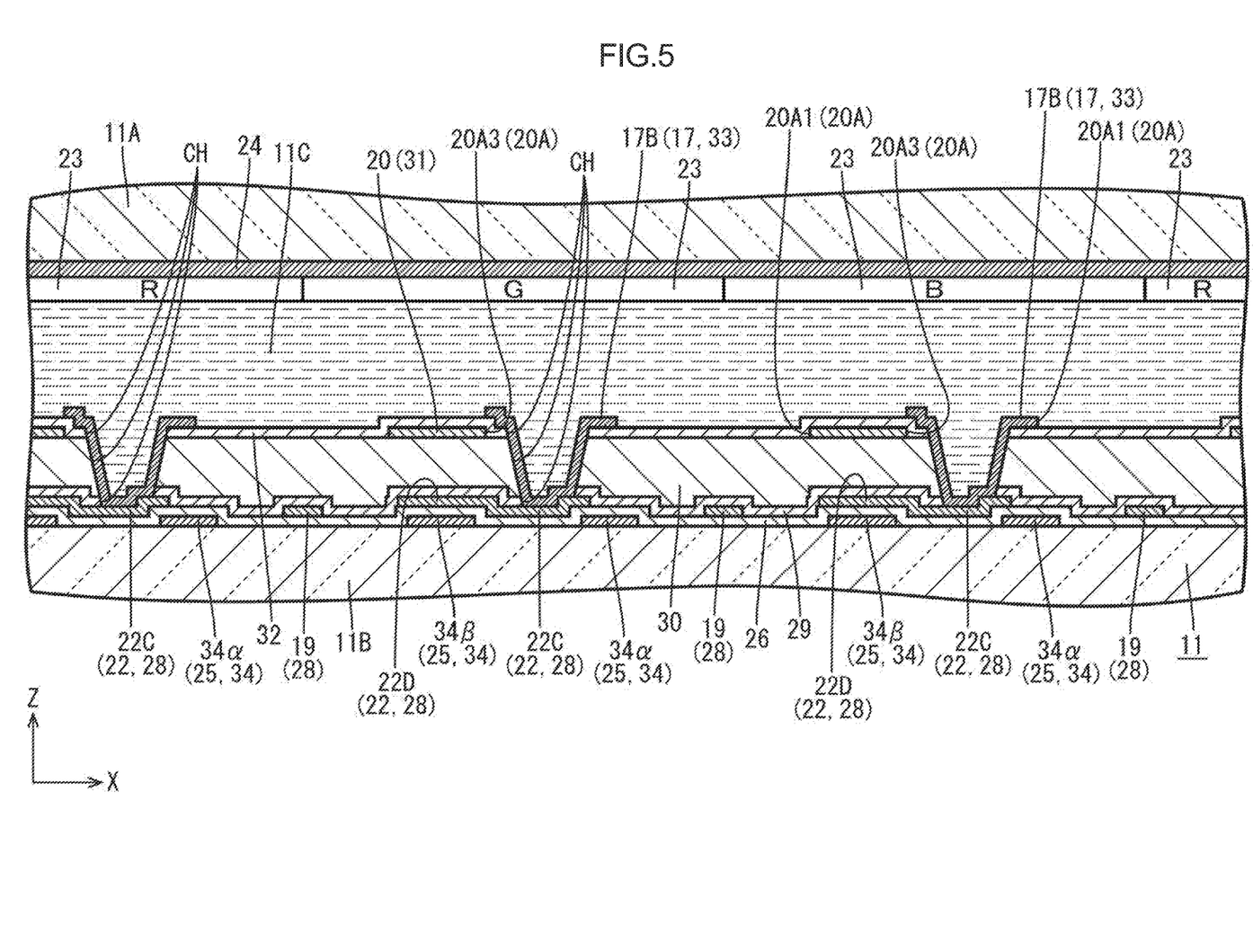
FIG. 5 is a cross-sectional view along line B-B in FIG. 2.

As illustrated in FIGS. 3 and 5, the blocking portions 34 include first blocking portions 34α and second blocking portions 34β. The first blocking portion 34α is disposed between the drain line connecting portion 17B and the first source line 19α. The first blocking portion 34α blocks the electric filed between the drain line connecting portion 17B and the first source line 19α. The first blocking portion 34α is formed from the first metal film 25 that forms the gate line 18 and the capacitance line 21. The first blocking portion 34α is coupled with the capacitance line 21. In FIG. 3, an area including the first blocking portion 34α and a section of the capacitance line 21 with which the first blocking portion 34α is coupled is indicated with the hatching that is different from the hatching of the area in which the opening 20A is formed. The first blocking portion 34α that is disposed between the drain connecting portion 17B and the first source line 19α blocks the electric field between the drain connecting portion 17B and the first source line 19α. Therefore, the parasitic capacitance induced by the electric field between the drain connecting portion 17B and the first source line 19α is reduced and the display quality is less likely to decrease. Furthermore, the first blocking portion 34α is connected to the capacitance line 21 that is at the same potential as the common electrode 20. Therefore, the first blocking portion 34α can properly exert blocking effect. In comparison to the gate line 18 that transmits scan signals, the capacitance line 21 is maintained at a lower potential. Therefore, the blocking performance of the first blocking portion 34α is stable and higher reliability can be achieved.

The second blocking portion 34β is disposed between the drain line connecting portion 17B and the second source line 19β. The second blocking portion 34β blocks the electric filed between the drain line connecting portion 17B and the second source line 19β. The second blocking portion 34β is formed from the first metal film 25 that forms the gate line 18 and the capacitance line 21. The second blocking portion 34β is coupled with the capacitance line 21. In FIG. 3, an area including the second blocking portion 34β and a section of the capacitance line 21 with which the second blocking portion 34β is coupled it indicated with the hatching that is different from the hatching of the area in which the opening 20A is formed. The second blocking portion 34β that is disposed between the drain connecting portion 17B and the second source line 19β blocks the electric field between the drain connecting portion 17B and the second source line 19β. Therefore, the parasitic capacitance induced by the electric field between the drain connecting portion 17B and the second source line 19β is reduced and the display quality is less likely to decrease. Furthermore, the second blocking portion 34β is connected to the capacitance line 21 that is at the same potential as the common electrode 20. Therefore, the second blocking portion 34β can properly exert blocking effect. In comparison to the gate line 18 that transmits scan signals, the capacitance line 21 is maintained at a lower potential. Therefore, the blocking performance of the second blocking portion 34β is stable and higher reliability can be achieved.

As illustrated in FIGS. 3 and 5, the first blocking portion 34α and the second blocking portion 34β are disposed to sandwich the drain line connecting portion 17B with respect to the X-axis direction. The first blocking portion 34α and the second blocking portion 34β protrude from the capacitance line 21 toward the gate line 18 in the Y-axis direction. The first blocking portion 34α and the second blocking portion 34β have rectangular shapes in a plan view. The first blocking portion 34α overlaps the opening 20A. The second blocking portion 34β does not overlap the opening 20A.

As illustrated in FIGS. 3 and 5, the first blocking portion 34α in an area that crosses a boundary between the first opening section 20A1 and the third opening section 20A3. The electric field generated between the drain line connecting portion 17B and the first source line 19α is stronger than the electric field generated between the drain line connecting portion 17B and the second source line 19β because the first source line 19α is closer to the drain line connecting portion 17B. Therefore, the parasitic capacitance of the first source line 19α tends to be larger. Furthermore, because the opening 20A is formed in the area of the common electrode 20 overlapping the first source line 19α and the drain line connecting portion 17B, the electric field is more likely to be generated between the drain line connecting portion 17B and the first source line 19α. The first blocking portion 34α is disposed between the drain line connecting portion 17B and the first source line 19α. Therefore, the first blocking portion 34α can effectively block the electric field and thus the parasitic capacitance can be effectively reduced. The first source line 19α can be repaired without a reduction in display quality. The first blocking portion 34α overlaps the drain line connecting portion 17B and the electrode connecting end 22C of the drain line 22. According to the configuration, the electric fields may be generated between the first blocking portion 34α and the section of the drain line connecting portion 17B and between the first blocking portion 34α and the section of the drain line 22. Therefore, the electric field between the drain line connecting portion 17B and the first source line 19α is effectively blocked and thus the display quality is less likely to decrease.

As illustrated in FIGS. 3 and 5, a large portion of the second blocking portion 34β overlaps the third portion 22D of the drain line 22 but does not overlap the drain line connecting portion 17B. Although the second blocking portion 34β does not overlap the opening 20A, the second blocking portion 34β is disposed between the drain line connecting portion 17B and the second source line 19β. Therefore, the second blocking portion 34β can block the electric filed between the drain line connecting portion 17B and the second source line 19β. According to the configuration, the display quality is less likely to decrease. Furthermore, because the first blocking portion 34α and the second blocking portion 34β are disposed to sandwich the drain line connecting portion 17B, the electric fields between the drain line connecting portion 17B and the first source line 19α and between the drain line connecting portion 17B and the second source line 19β can be blocked by the first blocking portion 34α and the second blocking portion 34β, respectively. Therefore, the display quality is less likely to decrease.

Figure 6:
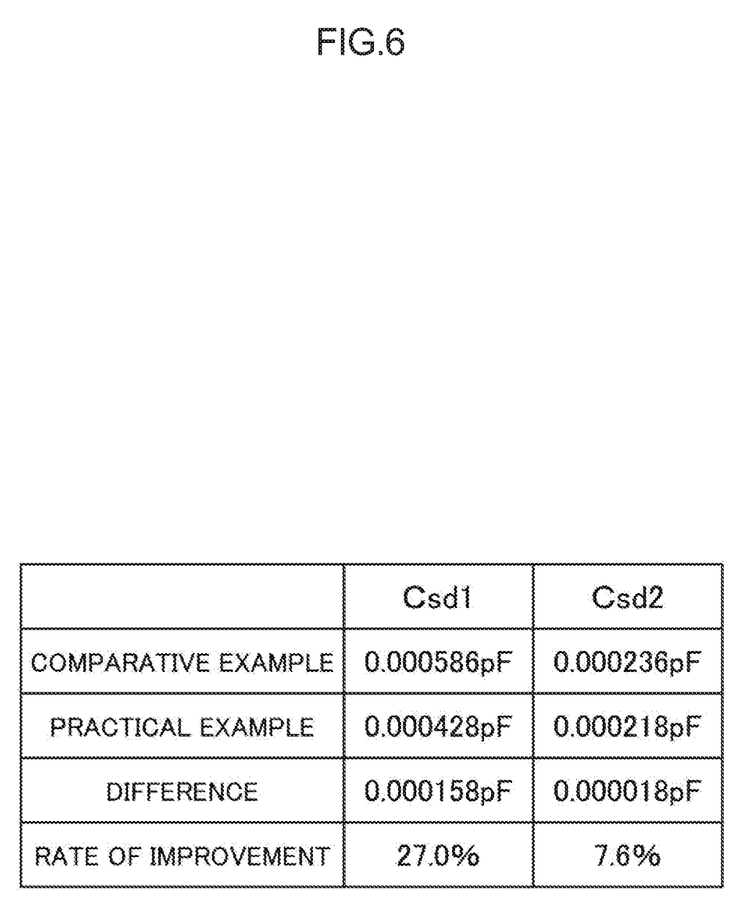
FIG. 6 is a table illustrating results of a comparative experiment.

A comparative experiment was conducted to determine whether the parasitic capacitance varied according to the presence or absence of the second blocking portion 34β. In the comparative experiment, a practical example and a comparative example were used. The practical example included the first blocking portion 34α and the second blocking portion 34β. The comparative example included the first blocking portion 34α but not the second blocking portion 34β. The configuration of the comparative example other than the second blocking portion 34β was the same as that of the practical example, that is, the liquid crystal panel 11. In the comparative experiment, a first parasitic capacitance Csd1 between the drain line connecting portion 17B and the first source line 19α and a second parasitic capacitance Csd2 between the drain line connecting portion 17B and the second source line 19β were measured in each of the practical example and the comparative example. The measurements are present in a table in FIG. 6. The table in FIG. 6 presents the measurements of the first parasitic capacitances Csd1 and the second parasitic capacitances Csd2 in picofarad (pF), differences between the practical example and the comparative example regarding the first parasitic capacitances Csd1 and the second parasitic capacitances Csd2 in picofarad (pF), and rates of improvement in percentage (%). Each rate of improvement was calculated by dividing each difference by each parasitic capacitance Csd1 or Csd2 and multiplying the result of the division by 100.

The results of the comparative experiment will be described. According to FIG. 6, the measurements of the second parasitic capacitances Csd2 are greater than the measurements of the first parasitic capacitances Csd1 in both practical example and comparative example. This may be because the first source line 19α is closer to the drain line connecting portion 17B in comparison to the second source line 19β and thus the electric field between the drain line connecting portion 17B and the first source line 19α may be stronger than the electric field between the drain line connecting portion 17B and the second source line 19β. In comparison to the comparative example, the measurements of the first parasitic capacitance Csd1 and the second parasitic capacitance Csd2 are smaller. The difference in the first parasitic capacitance Csd1 between the practical example and the comparative example, which is 0.000158 pF, is greater than the difference in the second parasitic capacitance Csd2 between the practical example and the comparative example, which is 0.000018 pF. Furthermore, the rate of improvement of the first parasitic capacitance Csd1, which is 27%, is greater than the rate of improvement of the second parasitic capacitance Csd2, which is 7.6%. This may be because the first blocking portion 34α is disposed between the drain line connecting portion 17B and the first source line 19α and thus the electric field between the drain line connecting portion 17B and the first source line 19α may be effectively blocked by the first blocking portion 34α. The difference between the first parasitic capacitance Csd1 and the second parasitic capacitance Csd2 in the practical example, which is 0.000210 pF, is less than the difference between the first parasitic capacitance Csd1 and the second parasitic capacitance Csd2 in the comparative example, which is 0.000350 pF. This may result from the difference in rate of improvement. The display quality was determined based on a threshold. A value was calculated by dividing an absolute value of the difference between the first parasitic capacitance Csd1 and the second parasitic capacitance Csd2 by a sum of capacitances related to the pixel (i.e., a sum of a capacitance Clc between the pixel electrode 17 and the common electrode 20 (a liquid crystal capacitance), a capacitance between the pixel electrode 17 and the capacitance line 21, a parasitic capacitance between the gate line 18 and the drain line 22, the first parasitic capacitance Csd1, and the second parasitic capacitance Csd2). If the calculated value was equal to or less than the threshold, the display quality was defined as good. If the calculated value was above the threshold, the display quality was defined as poor. In the practical example, the difference between the first parasitic capacitance Csd1 and the second parasitic capacitance Csd2 was smaller in comparison to the comparative example. Therefore, the calculated value is more likely to be equal or less than the threshold. Namely, the practical example can achieve higher display quality in comparison to the comparative example. More specifically, if the sum of the capacitances is 0.528 pF, the calculated value of the comparative example is 0.000633 and the calculated value of the practical example is 0.000398. If the threshold is 0.0004, the calculated value of the comparative example is above the threshold and the calculated value of the practical example is below the threshold. Namely, the display quality of the practical example is higher than the display quality of the comparative example.

As described above, the liquid crystal display device 10 (the display device) includes the pixel electrodes 17, the source lines 19 (the signal lines), the drain lines 22 (the pixel electrode connecting lines), and the blocking portions 34. The source lines 19 transmit the signals to the pixel electrodes 17. The drain lines 22 are connected to the pixel electrodes 17 that are disposed the predefined distances apart from the source lines 19. The blocking portions 34 are disposed between the source lines 19 and the drain lien connecting portions 17B (connecting portions) to block the electric fields between the drain line connecting portions 17B and the source lines 19.

According to the configuration, the voltages based on the signals transmitted through the source lines 19 are applied to the pixel electrodes 17 via the drain lines 22. The blocking portions 34 are disposed between the drain line connecting portions 17B and the source lines 19 to block the electric fields between the drain line connecting portions 17B and the source lines 19. Therefore, the parasitic capacitances induced by the electric fields between the drain line connecting portions 17B and the source lines 19 are reduced and thus the display quality is less likely to decrease.

The common electrode 20 is disposed in the layer different from the layer in which the pixel electrodes 17 are disposed and the layer in which the source lines 19 and the drain lines 22 are disposed. The common electrode 20 is disposed to overlap at least the pixel electrodes 17. The common electrode 20 includes the openings 20A in the areas that cover the sections of the source lines 19 and the sections of the drain line connecting portions 17B. The blocking portions 34 include the first blocking portions 34α overlapping the openings 20A. When the pixel electrodes 17 are charged, images are displayed based on the potential differences between the pixel electrodes 17 and the common electrode 20. Because the common electrode 20 includes the openings 20A in the areas that cover the sections of the source lines 19 and the sections of the pixel electrodes 17, the source lines 19 are less likely to be shorted to the common electrode 20 during the repair of the source lines 19. However, the electric fields are more likely to be generated between the drain line connecting portions 17B and the source lines 19 due to the openings 20A. The display quality may decrease due to the parasitic capacitances induced by the electric fields. The blocking portions 34 include the first blocking portions 34α disposed between the drain line connecting portions 17B and the source lines 19 to overlap the openings 20A of the common electrode 20. With the first blocking portions 34α, the electric fields between the drain line connecting portions 17B and the source lines 19 can be effectively blocked. Therefore, the parasitic capacitances induced by the electric fields between the drain line connecting portions 17B and the source lines 19 can be effectively reduced. The source lines 19 can be repaired without a reduction in display quality.

The blocking portions 34 include the second blocking portions 34β that do not overlap the openings 20A. With the second blocking portions 34β, in addition to the first blocking portions 34α, the electric fields between the drain line connecting portions 17B and the source lines 19 are further blocked. Therefore, the display quality is further less likely to decrease.

The source lines 19 are disposed to sandwich the pixel electrodes 17. The first blocking portions 34α and the second blocking portions 34β are disposed to sandwich the drain line connecting portions 17B. With the first blocking portions 34α and the second blocking portions 34β, the electric fields between the drain line connecting portions 17B and the source lines 19 are blocked. According to the configuration, the display quality is further less likely to decrease.

Each opening 20A is formed in the area of the common electrode 20 covering the section of the first source line 19α (the first signal line) and the section of the drain line connecting portion 17B. The first blocking portion 34α is disposed between the drain line connecting portion 17B and the first source line 19α. This configuration is preferable for the repair of the first source line 19α. The electric field between the drain line connecting portion 17B and the first source line 19α tends to be stronger than the electric field between the drain line connecting portion 17B and the second source line 19β and thus the parasitic capacitance tends to be greater. Furthermore, the electric field is more likely to be generated between the drain line connecting portion 17B and the first source line 19α because of the area in which the opening 20A is formed. Because the first blocking portion 34α is disposed between the drain line connecting portion 17B and the first source line 19α, the electric field can be effectively blocked and thus the parasitic capacitance can be effectively reduced. Therefore, the display quality is less likely to decrease.

The first blocking portion 34α is disposed to overlap the drain line connecting portion 17B and the drain line 22. According to the configuration, the electric field generated between the drain line connecting portion 17B and the source line 19 due to the electric field between at least a section of the drain line connecting portion 17B and at least a section of the drain line 22 can be effectively blocked. Therefore, the display quality is less likely to decrease.

Each opening 20A is formed in the area of the common electrode 20 overlapping the drain line connecting portion 17B, the source line 19, and the drain line 22. According to the configuration, during the repair of the drain line 22, the drain line 22 is less likely to be shorted to the common electrode 20. According to the opening 20A, the electric field may be generated between the drain line connecting portion 17B and the source line 19. However, the electric field is blocked by the blocking portion 34 and thus the display quality is less likely to decrease.

Each capacitance line 21 extends to cross the source lines 19. Each capacitance line 21 is disposed in the layer different from the layer in which the pixel electrodes 17 are disposed and the layer in which the source lines 19 are disposed to overlap the pixel electrodes 17. The blocking portions 34 are connected to the capacitance lines 21. The pixel electrodes 17 are charged to the potentials with the voltages applied via the source liens 19 and the drain lines 22 and the pixel electrodes 17 hold the potentials with the capacitances between the pixel electrodes 17 and the overlapping capacitance lines 21. The blocking portions 34 are connected to the capacitance lines 21 and thus the blocking portions 34 can exert sufficient blocking effect. In comparison to the lines that transmit the signals for image display, the capacitance lines 21 are maintained at low potentials. Therefore, the blocking performance of the blocking portions 34 are stable and thus high reliability can be achieved.

Second Embodiment

A second embodiment will be described with reference to FIG. 7. The second embodiment includes a common electrode 120 that includes openings 120A formed in areas different from those of the first embodiment. Configurations, functions, and effects similar to those of the first embodiment will not be described.

Figure 7:
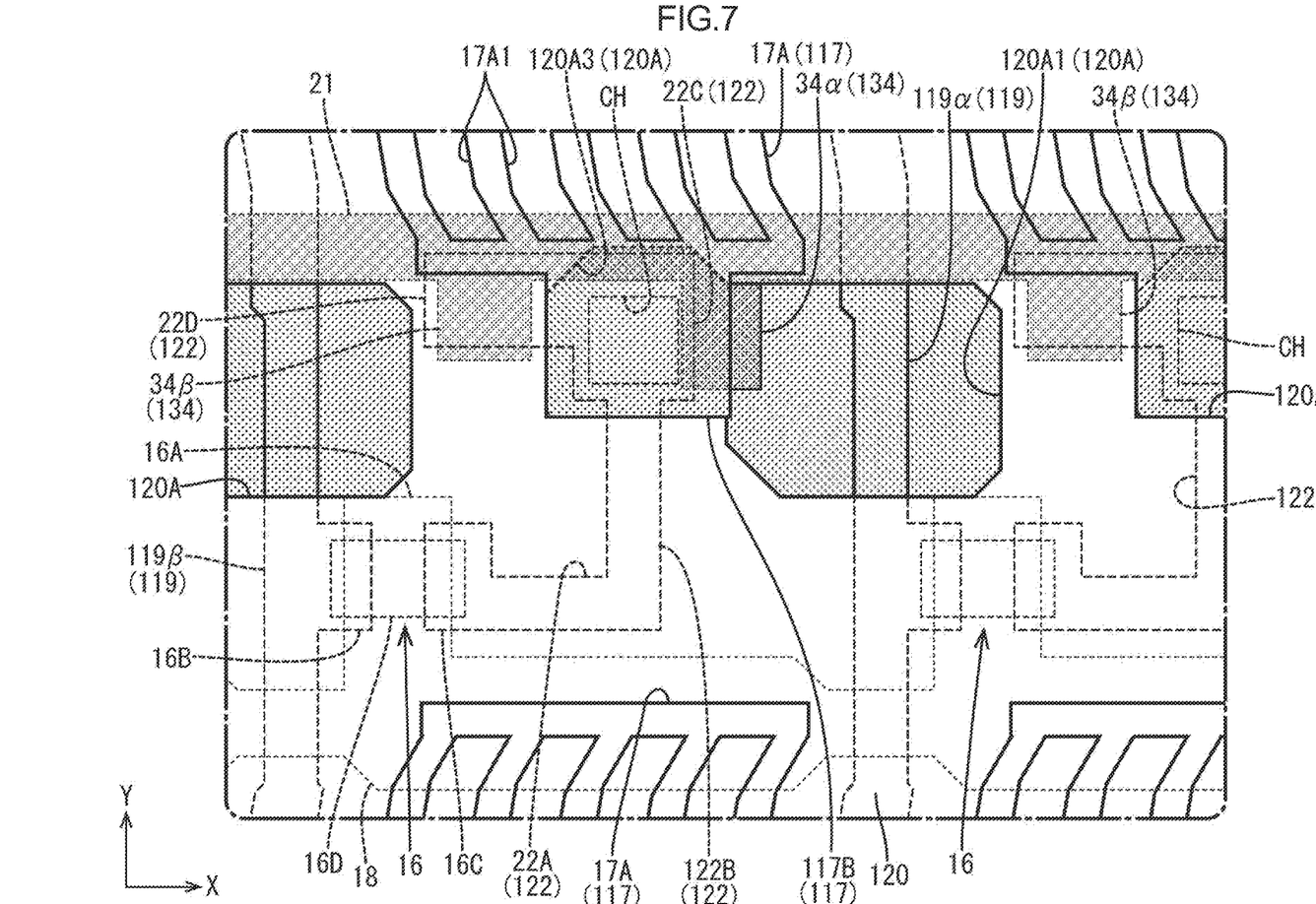
FIG. 7 is a magnified plan view of a TFT and therearound on an array substrate in a display area according to a second embodiment.

As illustrated in FIG. 7, the common electrode 120 includes the openings 120A in the areas overlapping drain line connecting portions 117B of pixel electrodes 117 and first source lines 119α but not overlapping large areas of second sections 122B of drain lines 122. Each opening 120A includes a first opening section 120A1 and a third opening section 120A2 but not the second opening section 20A2 in the first embodiment. According to the configuration, blocking portions 134 can exert sufficient levels of parasitic capacitance reducing effect similar to the first embodiment. This configuration is especially advantageous when repairs of the source lines are in consideration but repairs of the drain lines 122 are not in consideration.

Third Embodiment

A third embodiment will be described with reference to FIG. 8. The third embodiment includes first blocking portions 234α having a different configuration from first blocking portions 34α in the first embodiment. Configurations, functions, and effects similar to those of the first embodiment will not be described.

Figure 8:
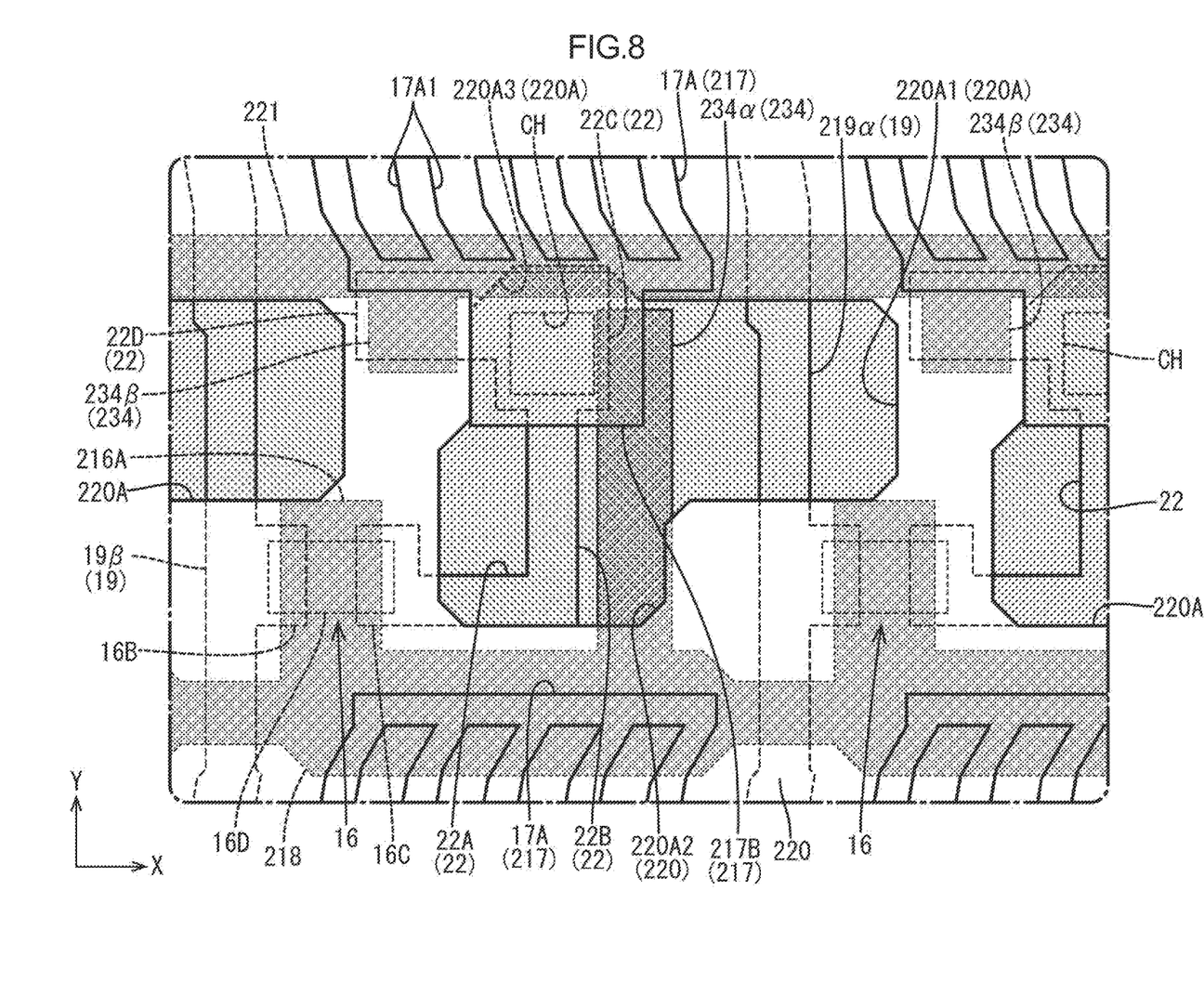
FIG. 8 is a magnified plan view of a TFT and therearound on an array substrate in a display area according to a third embodiment.

As illustrated in FIG. 8, the third embodiment includes blocking portions 234 that include the first blocking portions 234α coupled with gate lines 218 and second blocking portions 234β coupled with capacitance lines 221. In FIG. 8, areas in which the blocking portion 234, the gate line 218 with which the blocking portions 234 are coupled including gate electrodes 216A, and the capacitance line 221 are indicated with hatching different from hatching of openings 220A. The first blocking portions 234α are formed from a first metal film that forms the gate lines 218. Each first blocking portion 234α extends from the gate line 218 toward the capacitance line 221 in the Y-axis direction. Each first blocking portion 234α is disposed between a drain line connecting portion 217B of a pixel electrode 217 and the first source line 219α. Each first blocking portion 234α is disposed to overlap a first opening section 220A1, a second opening section 220A2, and a third opening section 220A3 of the opening 220A in a common electrode 220. With the blocking portions 234α, the third embodiment can exert a sufficient level of parasitic capacitance reducing effect.

Other Embodiments

The technology described herein is not limited to the embodiments described above and with reference to the drawings. The following embodiments may be included in the technical scope.

(1) The first blocking portions and the second blocking portions may be disposed not to overlap the drain lines. Either the first blocking portions or the second blocking portions may be disposed not to overlap the drain lines. The third sections of the drain lines may be omitted so that the second blocking portions do not overlap the drain lines.

(2) The first blocking portions may be disposed to overlap sections of the drain lines other than the electrode connecting ends. The first blocking portions may be disposed to overlap not only the electrode connecting ends but also the second sections.

(3) The first blocking portions may be disposed not to overlap the drain line connecting portions of the pixel electrodes.

(4) The first blocking portions may be disposed to overlap not only the first opening sections and the second opening sections but also the third opening sections. Alternatively, the first blocking portions may be disposed to overlap only the first opening sections but not the second opening sections and the third opening sections.

(5) All the blocking portions may be configured to overlap the openings or all the blocking portions may be configured not to overlap the openings. As long as the drain line connecting portions are sandwiched between the blocking portions, the electric fields between the drain line connecting portions and the source lines that sandwich the pixel electrodes are blocked by the blocking portions. Namely, sufficient parasitic capacitance reducing effect can be achieved.

(6) The areas of the common electrode in which the openings are formed, the two-dimensional arrangement of the openings, the areas in which the first blocking portions are formed, the two-dimensional arrangement of the first blocking portions, the areas in which the second blocking portions are formed, the two-dimensional arrangement of the second blocking portions, and the overlaps and the positional relation of the first blocking portions relative to the openings in the common electrode may be altered where appropriate.

(7) Either the first blocking portions or the second blocking portions may be omitted.

(8) The distance between each drain line connecting portion and the first source line and the distance between the drain line connecting portion and the second source line may be set equal.

(9) The drain line connecting portions may be disposed closer to the first source lines in every other rows and closer to the second source lines in other rows. In this case, the first blocking portions and the second blocking portions may be disposed in a flipped manner.

(10) The blocking portions may be disposed in a layer different from the layer in which the capacitance lines and the gate lines are disposed and connected to the capacitance lines or the gate lines. In this case, contact holes may be formed in the insulating film disposed between the blocking portions and the capacitance lines or the gate lines.

(11) The blocking portions may be connected to the lines other than the capacitance lines or the gate lines or to the electrodes.

(12) The areas of the insulating films in which the contact holes are formed and two-dimensional shapes of the contact holes may be altered where appropriate. The contact holes in the insulating film may be formed in areas or two-dimensional shape different from those of the contact holes in other insulating films.

(13) The pixel electrodes may be disposed in a lower layer and the common electrode may be disposed in an upper layer. In this case, the third opening sections of the openings in the common electrode may be omitted.

(14) The technology described herein may be applied to liquid crystal panels having square shapes, round shapes, and oval shapes.

(15) The driver may be mounted to the flexible circuit board with the chip-on-film (COF) technology.

(16) The channels of the TFTs may be formed from a semiconductor film made of continuous grain (CG) silicon, which is a kind of polysilicon, or amorphous silicon.

(17) The technology described herein may be applied to a display panel including color filters that include red, green, blue, and yellow color portions.

(18) The technology described herein may be applied to a display panel including a pair of substrates and functional organic molecules (a medium layer) other than the liquid crystal molecules between the substrates.

(19) The technology described herein may be applied to a liquid crystal panel including switching components other than the TFTs (e.g., thin film diodes (TFDs)). The technology described herein may be applied to a black-and-white liquid crystal panel.

(20) The technology described herein may be applied to other types of display panels including plasma display panels (PDPs) organic light-emitting diode display panels, electrophoretic display (EPD) panels and micro electro mechanical systems (MEMS) display panels.

The invention claimed is:

1. A display device comprising:
a pixel electrode;
at least one signal line configured to transmit a signal to the pixel electrode;
a pixel electrode connecting line disposed a predefined distance apart from the at least one signal line and connected to the pixel electrode; and
at least one blocking portion disposed between a connecting portion of the pixel electrode connected to the pixel electrode connecting line and the at least one signal line to block an electric field between the connection portion and the at least one signal line,
the display device further comprising a common electrode disposed in a layer different from a layer in which the at least one signal line is disposed and a layer in which the pixel electrode connecting line is disposed to overlap at least the pixel electrode, wherein
the common electrode includes an opening in an area covering at least a section of the at least one signal line and the connecting portion of the pixel electrode, and
the at least one blocking portion includes a blocking portion disposed to overlap the opening,
wherein the at least one blocking portion further includes a blocking portion disposed not to overlap the opening.

2. The display device according to claim 1, wherein
the at least one signal line includes at least a first signal line and a second signal line disposed to sandwich the pixel electrode, and the blocking portion disposed to overlap the opening and the blocking portion disposed not to overlap the opening are disposed to sandwich the connecting portion of the pixel electrode.

3. A display device comprising:
a pixel electrode;
at least one signal line configured to transmit a signal to the pixel electrode;
a pixel electrode connecting line disposed a predefined distance apart from the at least one signal line and connected to the pixel electrode; and
at least one blocking portion disposed between a connecting portion of the pixel electrode connected to the pixel electrode connecting line and the at least one signal line to block an electric field between the connection portion and the at least one signal line,
the display device further comprising a common electrode disposed in a layer different from a layer in which the at least one signal line is disposed and a layer in which the pixel electrode connecting line is disposed to overlap at least the pixel electrode, wherein
the common electrode includes an opening in an area covering at least a section of the at least one signal line and the connecting portion of the pixel electrode, and
the at least one blocking portion includes a blocking portion disposed to overlap the opening,
wherein the at least one signal line includes at least a first signal line and a second signal line disposed to sandwich the pixel electrode,
the first signal line and the second signal lines are disposed with a distance of the first signal line from the connecting portion and a distance of the second signal line from the connecting portion different from each other,
the distance of the first signal line from the connecting portion is less than the distance of the second signal line from the connecting portion,
the area of the common electrode in which the opening is formed covers at least a section of the first signal line and the connecting portion, and
the blocking portion disposed to overlap the opening is disposed between the connecting portion and the first signal line.

4. The display device according to claim 1, wherein the blocking portion disposed to overlap the opening is disposed to overlap at least a section of the connecting portion of the pixel electrode and at least a section of the pixel electrode connecting line.

5. The display device according to claim 1, wherein the area of the common electrode in which the opening is formed covers the section of the at least one signal line, the connecting portion of the pixel electrode, and a section of the pixel electrode connecting line.

6. A display device comprising:
a pixel electrode;
at least one signal line configured to transmit a signal to the pixel electrode;
a pixel electrode connecting line disposed a predefined distance apart from the at least one signal line and connected to the pixel electrode; and
at least one blocking portion disposed between a connecting portion of the pixel electrode connected to the pixel electrode connecting line and the at least one signal line to block an electric field between the connection portion and the at least one signal line,
the display device further comprising a capacitance line extending to cross the at least one signal line and being disposed in a layer different from a layer in which the pixel electrode is disposed and a layer in which the signal line is disposed to overlap the pixel electrode, wherein
the at least blocking portion is connected to the capacitance line.

7. The display device according to claim 3, wherein the blocking portion disposed to overlap the opening is disposed to overlap at least a section of the connecting portion of the pixel electrode and at least a section of the pixel electrode connecting line.

8. The display device according to claim 3, wherein the area of the common electrode in which the opening is formed covers the section of the at least one signal line, the connecting portion of the pixel electrode, and a section of the pixel electrode connecting line.

9. The display device according to claim 6, wherein the blocking portion disposed to overlap the opening is disposed to overlap at least a section of the connecting portion of the pixel electrode and at least a section of the pixel electrode connecting line.

10. The display device according to claim 6, wherein the area of the common electrode in which the opening is formed covers the section of the at least one signal line, the connecting portion of the pixel electrode, and a section of the pixel electrode connecting line.

* * * * *